(12) United States Patent
Choserot et al.

(10) Patent No.: US 8,143,694 B2
(45) Date of Patent: Mar. 27, 2012

(54) FUSE DEVICE

(75) Inventors: Vianney Choserot, Antibes (FR); Gunther Lehmann, Holzkirchen (DE); Franz Ungar, Munich (DE)

(73) Assignee: Infineon Technologies AG, Neubiberg (DE)

( * ) Notice: Subject to any disclaimer, the term of this patent is extended or adjusted under 35 U.S.C. 154(b) by 328 days.

(21) Appl. No.: 12/131,134

(22) Filed: Jun. 2, 2008

(65) Prior Publication Data
US 2009/0294900 A1   Dec. 3, 2009

(51) Int. Cl.
*H01L 23/52* (2006.01)

(52) U.S. Cl. ............... 257/529; 257/665; 257/E21.498; 257/E23.149

(58) Field of Classification Search .................. 257/529, 257/E23.149, 665, E21.498
See application file for complete search history.

(56) References Cited

U.S. PATENT DOCUMENTS

| | | | |
|---|---|---|---|
| 7,211,843 B2 * | 5/2007 | Low et al. | 257/209 |
| 7,368,801 B2 * | 5/2008 | Otsuka et al. | 257/529 |

\* cited by examiner

*Primary Examiner* — Tan N Tran
(74) *Attorney, Agent, or Firm* — Infineon Technologies AG Patent Department

(57) ABSTRACT

Implementations are presented herein that relate to a fuse device, an integrated circuit including a fuse device, a method of implementing a fuse device and a method of programming a fuse device.

16 Claims, 8 Drawing Sheets

FUSE DEVICE

BACKGROUND

In semiconductor devices, fuses can be employed in a variety of applications. A fuse can be employed to store information used to customize a semiconductor device. Such use includes trimming the semiconductor device to meet desired operating characteristics and adapting the semiconductor device to specific applications, e.g. adjusting the speed of the semiconductor device by adjusting a resistance of a current path. Further, a fuse can be used to store an identification on a semiconductor device. A fuse can also be used to replace a defective element on a semiconductor device by a duplicate or a redundant element on the same semiconductor device.

Typically, fuses or fusible links are incorporated in a design of a semiconductor device, wherein the fuses are selectively blown or degraded. The process of selectively blowing or degrading ruses is generally referred to as programming. Electrically programmable fuses are also known as efuses. An efuse can be programmed by applying an electrical current to the fusible link of the efuse. Passing an electrical current of a sufficient magnitude causes the fusible link to change its structure, thereby creating a more resistive path or an open in the fuse link.

As opposed to efuses, laser energy is used to evaporate a metal link in a fuse link, of a laser-fuse, thus creating a more resistive path or an open in the fuse link of the laser-fuse. Blowing fuses with a laser, however, can potentially increase manufacturing costs, since additional components such, as the laser and other associated equipment for alignment of the laser is generally required.

BRIEF DESCRIPTION OF THE DRAWINGS

The detailed description is described with reference to the accompanying figures. In the figures, the left-most digit of a reference number identifies the Figure in which the reference number first appears. The use of the same reference numbers in different Figures indicates similar of identical items.

DETAILED DESCRIPTION

Figure 1:
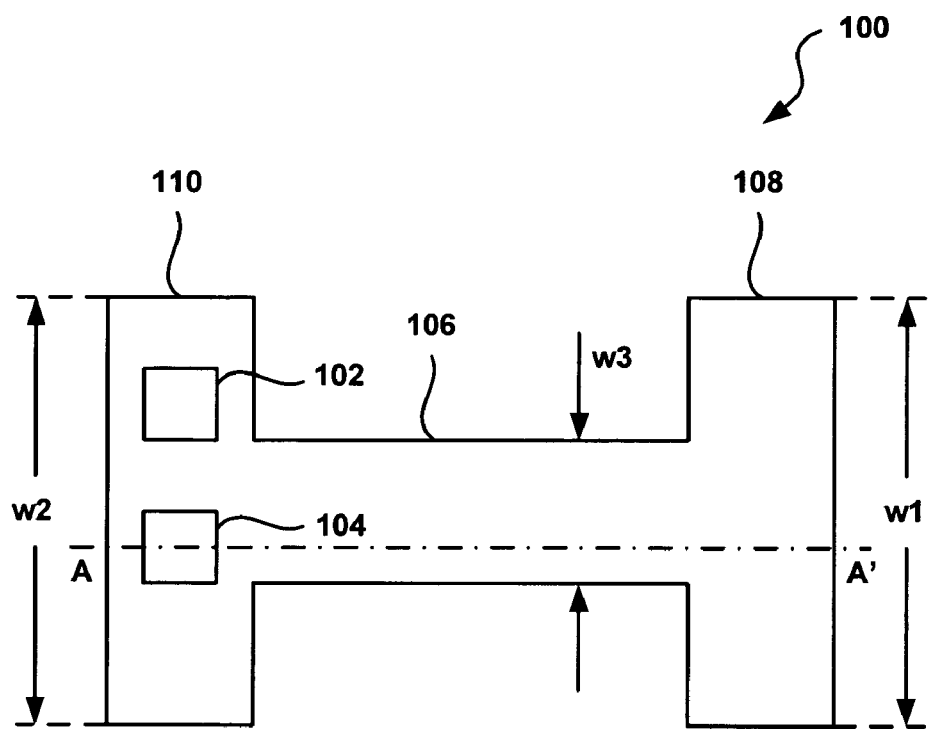
FIG. 1 illustrates a plan view of a schematic diagram of a fuse device that includes a plurality of contact members.

FIG. 1 illustrates a plan view of a schematic diagram of a fuse device 100 in accordance with an implementation described herein. The fuse device 100 includes a plurality of contact members 102 and 104. At least one of the plurality of contact members 102 and 104 is restricted to being usable during a programming operation. Additionally of alternatively, at least one of the plurality of contact members 102 and 104 is restricted to being usable during a reading operation.

The fuse device 100 may include a fuse link region 106. At a first end of the fuse link region 106, a first contact region 108 may be electrically coupled with the fuse link region 106. At a second end of the fuse link region 106, a second contact region 110 may be electrically coupled with the fuse link region 106. The second contact region 110 may include the plurality of contact members 102 and 104.

The width w1 of the first contact region 108 may be equal to or wider than the width w3 of the fuse link region 106. The width w2 of the second contact region 110 may be equal to or wider than the width w3 of the fuse link region 106. As illustrated in FIG. 1, the width w1 of the first contact region 108 may be equal to the width w2 of the second contact region 110. Alternatively, the width w1 of the first contact region 108 may not be equal to the width w2 of the second contact region 110.

Figure 2:
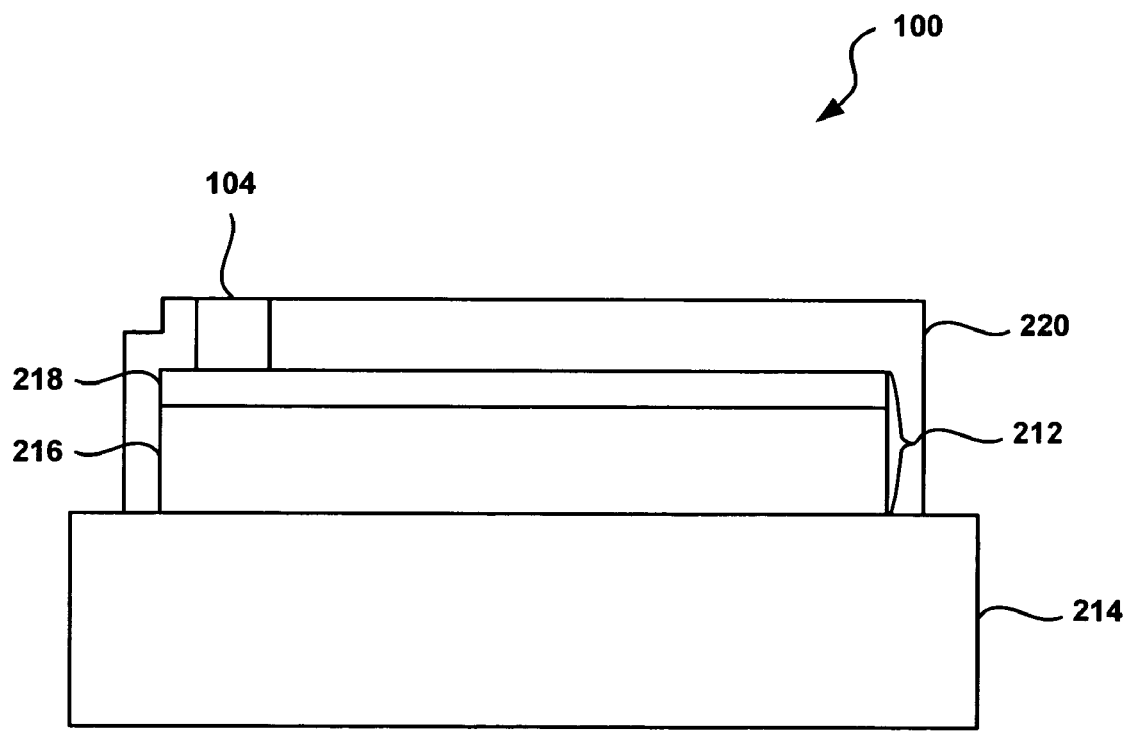
FIG. 2 illustrates a cross-sectional view of the fuse device of FIG. 1.

FIG. 2 illustrates a cross-sectional view along line A-A' of the fuse device 100 as illustrated and described in connection with FIG. 1. The fuse device 100 may have a layer of fuse material 212 formed on or above a substrate 214. The fuse material layer 212 may be provided at a uniform thickness. The fuse material layer 212 may include two stacked layers 216 and 218. The first layer 216 of the fuse material layer 212 may be a polysilicon and the second layer 218 of the fuse material layer 212 may be a silicide.

A plurality of contact members 102 and 104 may be formed on or above the fuse material layer 212. An insulating layer 220 may separate the plurality of contact members 102 and 104 of each other. Further, the insulating layer 220 may electrically isolate the fuse device 100 from other devices. Note that in FIG. 1 and FIGS. 3-9 the insulating layer 220 is not shown for illustration purposes.

Figure 3:
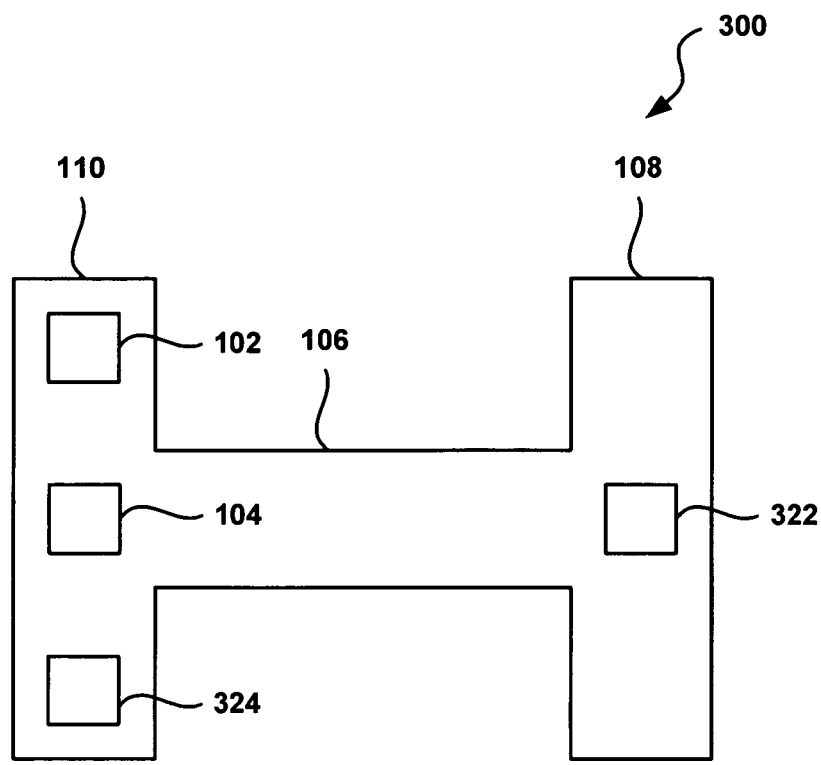
FIG. 3 illustrates a plan view of a schematic diagram of a fuse device that may be programmed by electromigration.

FIG. 3 illustrates a plan view of a schematic diagram of a fuse device 300 in accordance with an implementation described herein. As described earlier herein, the fuse device 300 includes a layer of fuse material formed on or above a substrate, a fuse link region 106, a first contact region 108 and a second contact region 110. The first contact region 108 may include one or more contact members 322. The second contact region 110 may include a plurality of contact members 102, 104 and 324. At least one of the plurality of contact members 102, 104 and 324 of the second contact region 110 may be restricted to being usable during a programming operation. Additionally or alternatively, at least one of the plurality of contact members 102, 104 and 324 of the second contact region 110 may be restricted to being usable during a reading operation.

The first contact region 108 may include an anode of the fuse device 300 and the second contact region 110 may include a cathode of the fuse device 300. The anode of the fuse device 300 may be electrically coupled with the cathode of the fuse device 300 via the fuse material layer of the fuse link region 106. The fuse device 300 may be programmed by electromigration. During a programming operation, the cathode may be negatively biased and the anode may be positively biased causing a programming current to flow through the fuse link region 106. If the programming current is increased to a level that exceeds a predetermined threshold, atoms in the fuse material layer may drift from the negatively biased cathode to the positively biased anode, leaving behind a depleted area in the fuse material layer of the second contact region 110 and/or of the fuse link region 106. For example, metal atoms in a silicided layer may drift from the negatively biased cathode to the positively biased anode. The movement of the atoms during electromigration may reduce the conductivity of the fuse device 300 and may increase the resistance of the fuse device 300. That is, during programming, the fuse device 300 may change from a low resistance state to a high resistance state.

During a reading operation, the cathode may be negatively biased and the anode may be positively biased causing a reading current to flow through the fuse material layer of the fuse link region 106. The reading current may be kept sufficiently low so as to avoid disturbance of the fuse device 300. During reading, a resistance of the fuse device 300 may be measured to determine if the fuse device 300 has been programmed or not. In one implementation, an unprogrammed state of the fuse device 300 may correspond to a logic '0' value, while a programmed state of the fuse device 300 may correspond to a logic '1' value. Depending on a sensitivity of a reading circuit, the fuse device 300 may be considered as programmed if a change in resistance is only modest.

Figure 4:
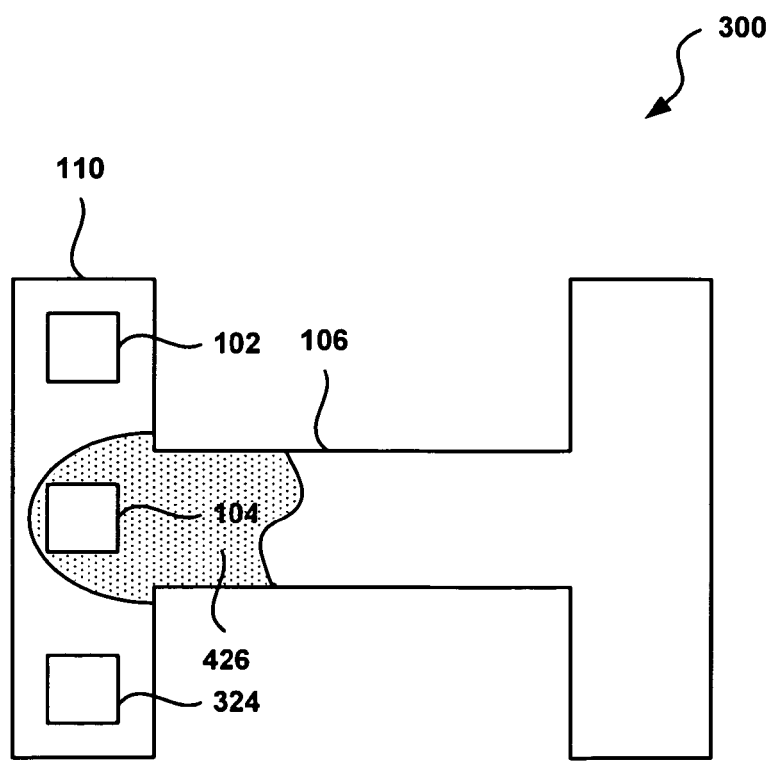
FIG. 4 illustrates a plan view of a schematic diagram of the fuse device of FIG. 3, after programming of the fuse device 300 has taken place.

FIG. 4 illustrates a plan view of a schematic diagram of the fuse device 300 as illustrated and described in connection with FIG. 3, after programming of the fuse device 300 has taken place. A depleted fuse area 426 denotes the area where atoms have moved away from the cathode towards the anode. During the programming operation, the programming current may be applied through the contact members 102 and 324, herein called programming contact members 102 and 324. During the reading operation, a reading current may be applied through the contact member 104, herein called reading contact member. One or several of the programming contact members 104 and 324 may be restricted to being usable during a programming operation. They may not be used during a reading operation. For the reading operation, only a subset of the contact members 102, 104 and 324 of the second contact region 110 may be used.

After programming of the fuse device 300, the whole area below the reading contact member 104 may be depleted. This may lead to a high resistance of the programmed fuse device 300 and to a predictable result when reading a state of the fuse device 300. The area below the programming contact members 102 and 324 may not be depleted during and after the programming of the fuse device 300. Therefore, during programming of the fuse device 300, a stable connection between the programming contact members 102 and 324 and the fuse material layer may be maintained, and a constant programming current may be applied through the programming contact members 102 and 324.

Figure 5:
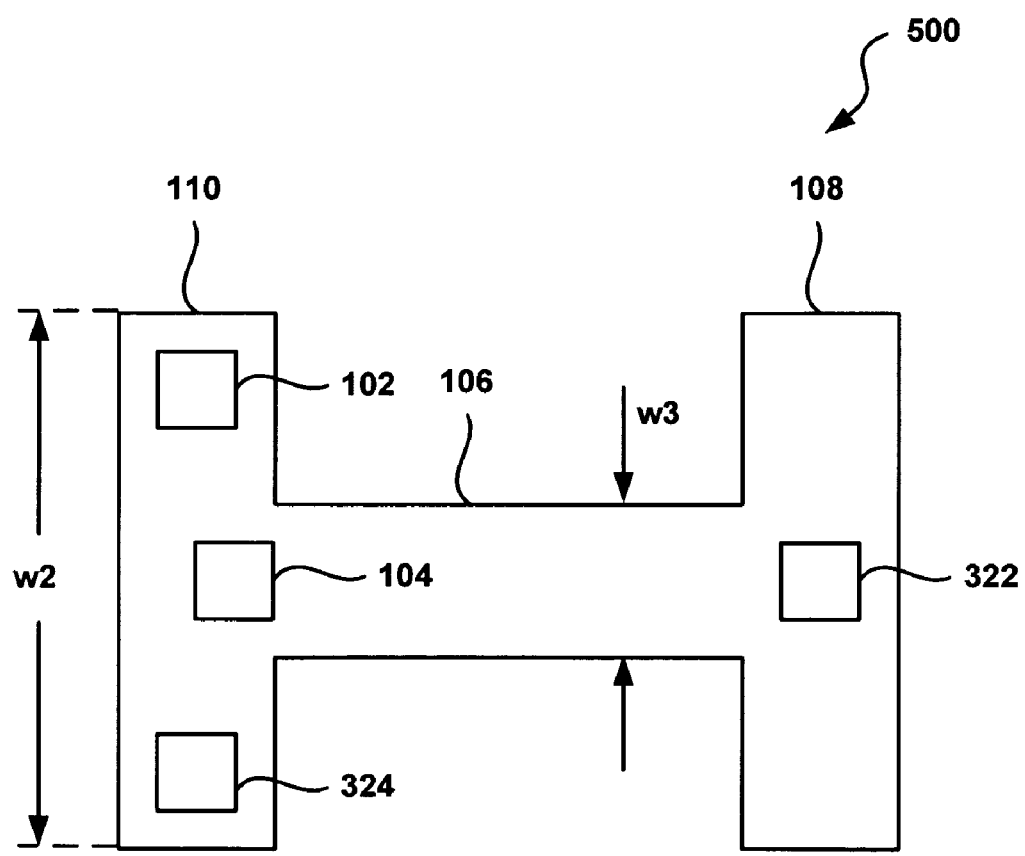
FIG. 5 illustrates a plan view of a schematic diagram of a fuse device. A reading contact member is placed closer to the fuse link region of the fuse device than a programming contact member.

FIG. 5 illustrates a plan view of a schematic diagram of a fuse device 500 in accordance with an implementation described herein. As described earlier herein, the fuse device 500 includes a fuse link region 106, a second contact region 110, programming contact members 102 and 324, and a reading contact member 104. The reading contact member 104 may be placed closer to the fuse link region 106 than one of the programming contact members 102 and 324. Since the width w2 of the second contact region 110 is wider than the width w3 of the fuse link region 106, during programming operation, the current density in the fuse link region 106 and close to the fuse link region 106 is higher than the current density in the remaining parts of the second contact region 110. Therefore, lower programming current and less programming time, respectively, may be required to deplete an area close to the fuse link region 106 of the second contact region 110 of the fuse device 500.

Figure 6:
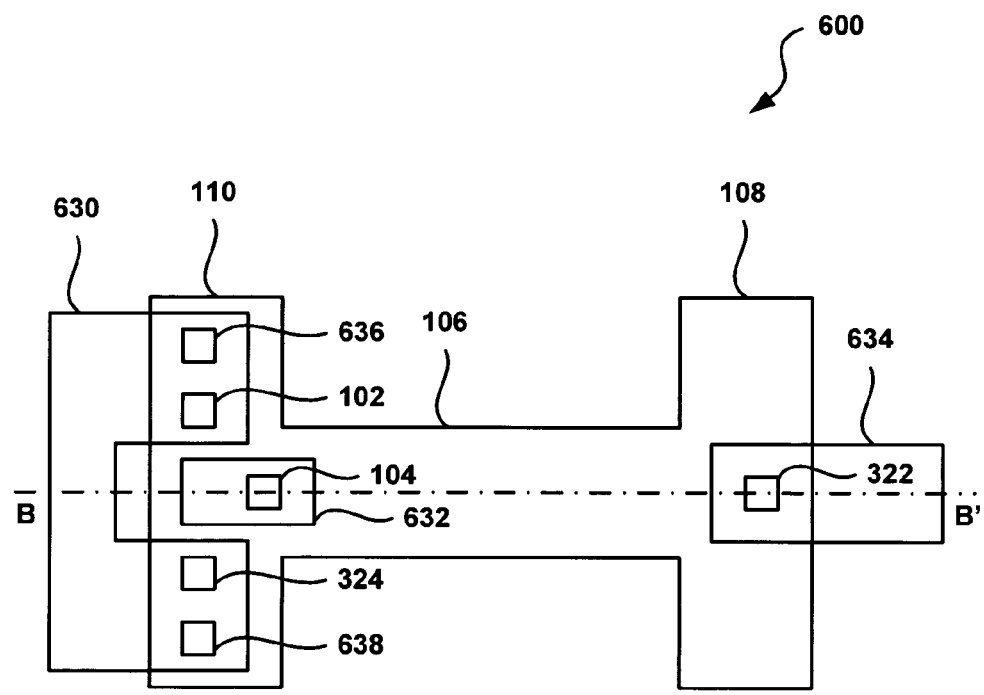
FIG. 6 illustrates a plan view of a schematic diagram of a fuse device. A connector is formed in a wiring layer that is disposed over a fuse material layer of the fuse device.
Figure 7:
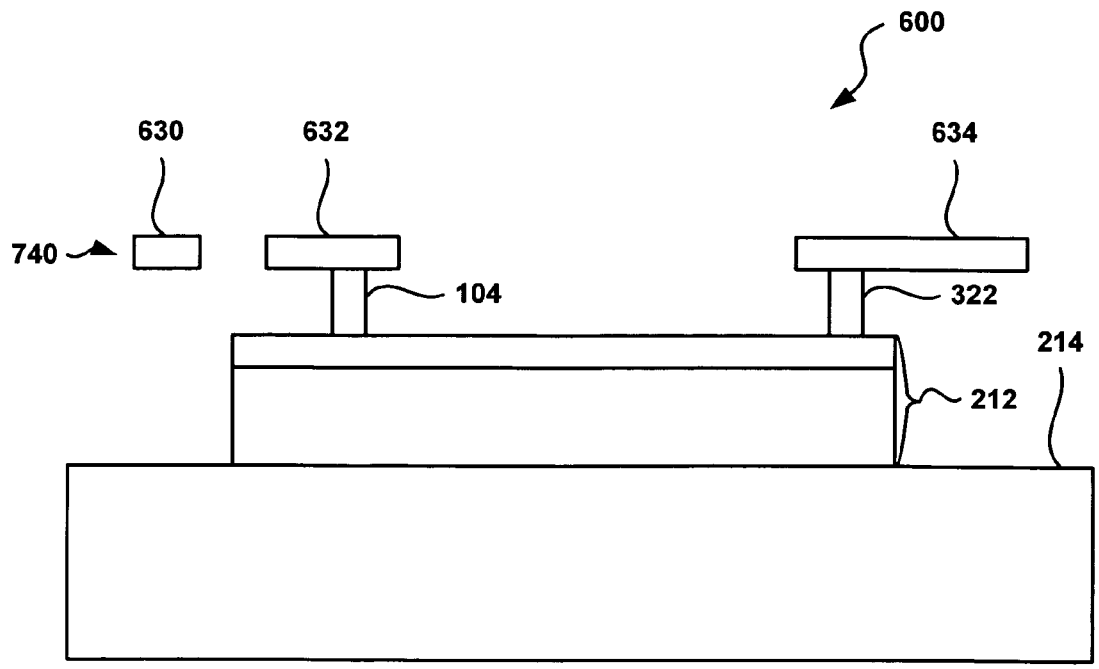
FIG. 7 illustrates a cross-sectional view of the fuse device of FIG. 6.

FIG. 6 illustrates a plan view of a schematic diagram of a fuse device 600 and FIG. 7 illustrates a cross-sectional view along line B-B' of the fuse device 600 in accordance with an implementation described herein. As described earlier herein, the fuse device 600 includes a layer of fuse material 212 formed on or above a substrate 214, a fuse link region 106, a first contact region 108 and a second contact region 110. A wiring layer 740 may be disposed over the fuse material layer 212. One or several connectors 630, 632, and 634 may be formed in the wiring layer 740. The one or several connectors 630, 632 and 634 may be electrically coupled with the fuse material layer 212 via one or several contact members 102, 104, 322, 324, 636 and 638, and the one or several connectors 630, 632 and 634 may extend to a location outside of the fuse material layer 212. Hence, the one or several connectors 630, 632 and 634 in the wiring layer 740 may electrically couple the fuse device 600 with other components (not shown in FIG. 6 and FIG. 7).

As illustrated in FIG. 6 and FIG. 7, programming contact members 102, 324, 636 and 638 of the second contact region 110 may be electrically coupled with a connector 630, herein called programming connector 630. The programming contact members 102, 324, 636 and 638 may be restricted to being usable during a programming operation. The programming connector 630 may be electrically coupled with the fuse material layer 212 via the programming contact members, 102, 324, 636 and 638.

As illustrated in FIG. 6 and FIG. 7, a reading contact member 104 may be electrically coupled with a connector 632, herein called reading connector 632. The reading contact member 104 may be restricted to being usable during a reading operation. The reading connector 632 may be electrically coupled with the fuse material layer 212 via the reading contact member 104.

A contact member 322 of the first contact region 108 may be electrically coupled with a connector 634. The connector 634 may be electrically coupled with the fuse material layer 212 via the contact member 322.

Figure 8:
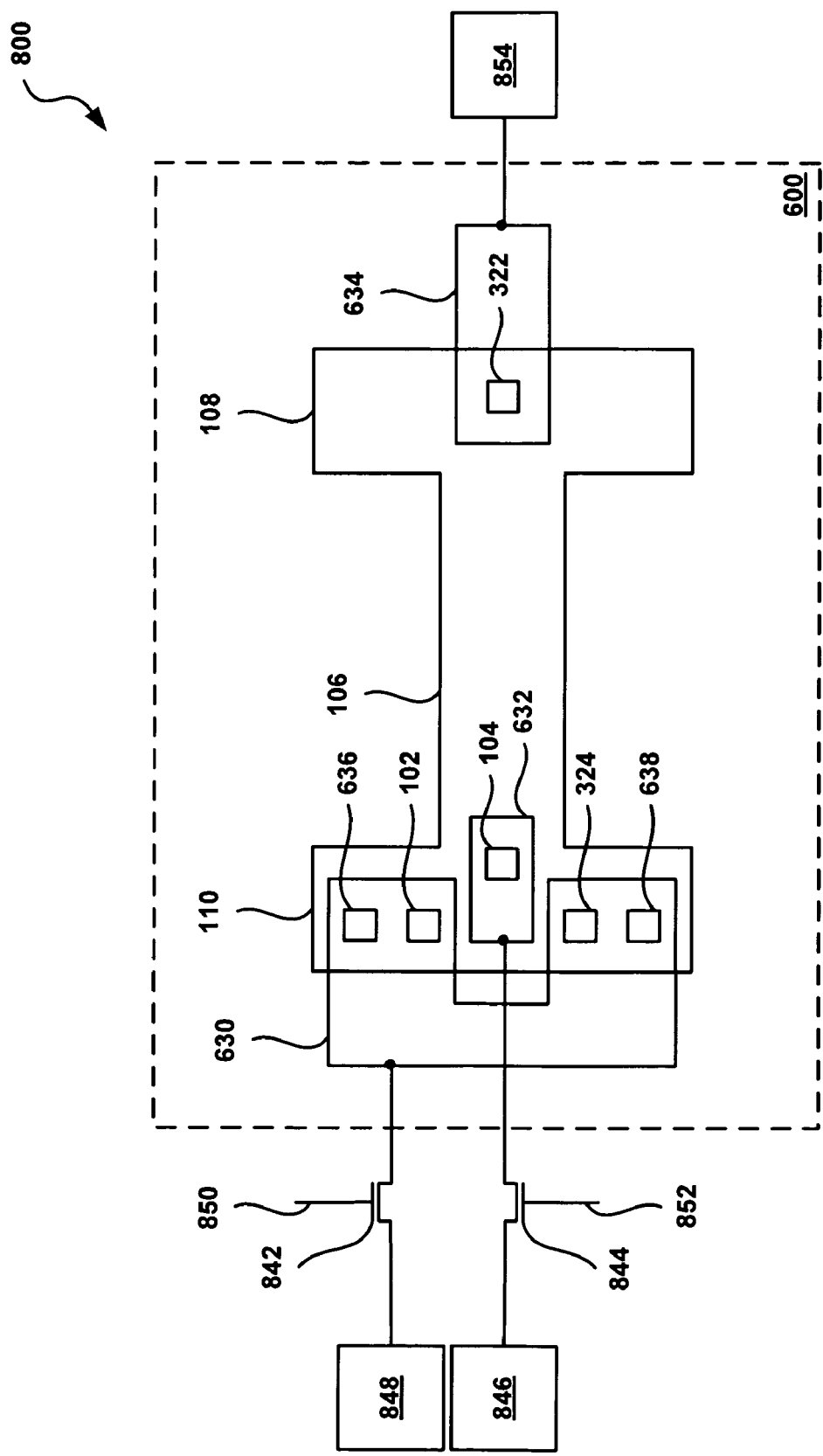
FIG. 8 illustrates a schematic diagram of a circuit that includes the fuse device of FIG. 6. A programming switch device and a reading switch device are coupled with the fuse device.

FIG. 8 illustrates a schematic diagram of a circuit 800 that includes a fuse device 600 as illustrated and described in connection with FIG. 6. The fuse circuit 800 may be part of an integrated circuit. At least a first contact member of a plurality of contact members 102, 104, 324, 636, 638 and 322 may be restricted to being usable during a programming operation. The circuit 800 may include a first switch device 842 to apply a current through the first contact member during the programming operation. The first switch device 842 is herein called programming switch device 842. At least a second contact member 104 of the plurality of contact members 102, 104, 324, 636, 638 and 322 may be restricted to being usable during a reading operation. A sensing circuit 846 may be coupled with the second contact member via a second switch device 844. The second switch device 844 is herein called reading switch device 844.

As illustrated in FIG. 8, the programming switch device 842 may couple the programming contact members 102, 324, 636 and 638 with a programming circuit 848 responsive to a first control signal 850. The programming circuit 848 may include a ground voltage supply or a negative voltage supply.

During a programming operation, the programming switch device 842 may be in a conductive state to apply a programming current from the anode of the fuse device 600 through the programming contact members 102, 324, 636 and 638 to the cathode of the fuse device 600. The fuse device 600 may be programmed by electromigration, and the programming switch device 842 may be implemented to limit the programming current to a magnitude insufficient to rupture the fuse device 600.

The reading switch device 844 may couple the reading contact member 104 with the sensing circuit 846 responsive to a second control signal 852. During a reading operation, the reading switch device 844 may be in a conductive state to apply a reading current from the anode of the fuse device 600 to the cathode of the fuse device 600 through the reading contact member 104. The sensing circuit 846 may read a programming state by sensing a resistance of the fuse device 600 to determine if the fuse device 600 is programmed or not. If the sensing circuit 846 senses a high resistance of the fuse device 600, the fuse device 600 may be in a programmed state and if the sensing circuit 846 senses a low resistance of the fuse device 600, the fuse device 600 may be in an unprogrammed state.

As the programming current may be higher than the reading current, the programming switch device 842 may be larger than the reading switch device 844. For example, the gate length and/or gate width of the programming switch device 842 may be larger than the gate length and/or gate width of the reading switch device 844.

The programming switch device 842 may be coupled with the programming contact members 102, 324, 636 and 638 via the programming connector 630, and the reading, switch device 844 may be coupled with the reading contact member 104 via the reading connector 632. The programming switch device 842 may include an NMOS transistor, and the gate of the NMOS transistor may be coupled with the first control signal 850. The reading switch device 844 may include a further NMOS transistor, and the gate of the further NMOS transistor may be coupled with the second control signal 852. The first control signal 850 and the second control signal 852 may be provided by a digital control circuit (not shown in FIG. 8)

The programming switch device 842 and the reading switch device 844 may not be linked together in the wiring layer 740 of the fuse device. They may only be coupled with each other via the fuse material layer 212 of the fuse device 600. Therefore, the junction and gate capacitance of the programming switch device 842 may not disturb the sensing of the resistance of the fuse device 600, which is performed via the reading switch device 844. Especially, during a reading operation, if the fuse device 600 is in a programmed, high resistance state, a parasitic current flowing through parasitic capacitances of the programming switch device 842 may indicate a low resistive fuse to the sensing circuit 846. However, as illustrated in FIG. 8, this may be prevented by coupling the programming switch device 842 with the reading switch device 844 only via the fuse material layer 212 of the fuse device 600 and not via the wiring layer 740.

A contact member 322 of the first contact region 108 of the fuse device 600 may be coupled with a circuit portion 854. The first contact region 108 may include an anode of the fuse device 600. The circuit portion 854 may include a power voltage supply. The contact member 322 may be coupled with the power voltage supply during a reading operation and during a programming operation. During the reading operation, a reading current may be provided to flow from the anode of the fuse device 600 to the cathode of the fuse device 600 and during the programming operation, a programming current may be provided to flow from the anode to the cathode. The circuit portion 854 may be coupled with the contact member of the first contact region 108 via a connector 634.

Figure 9:
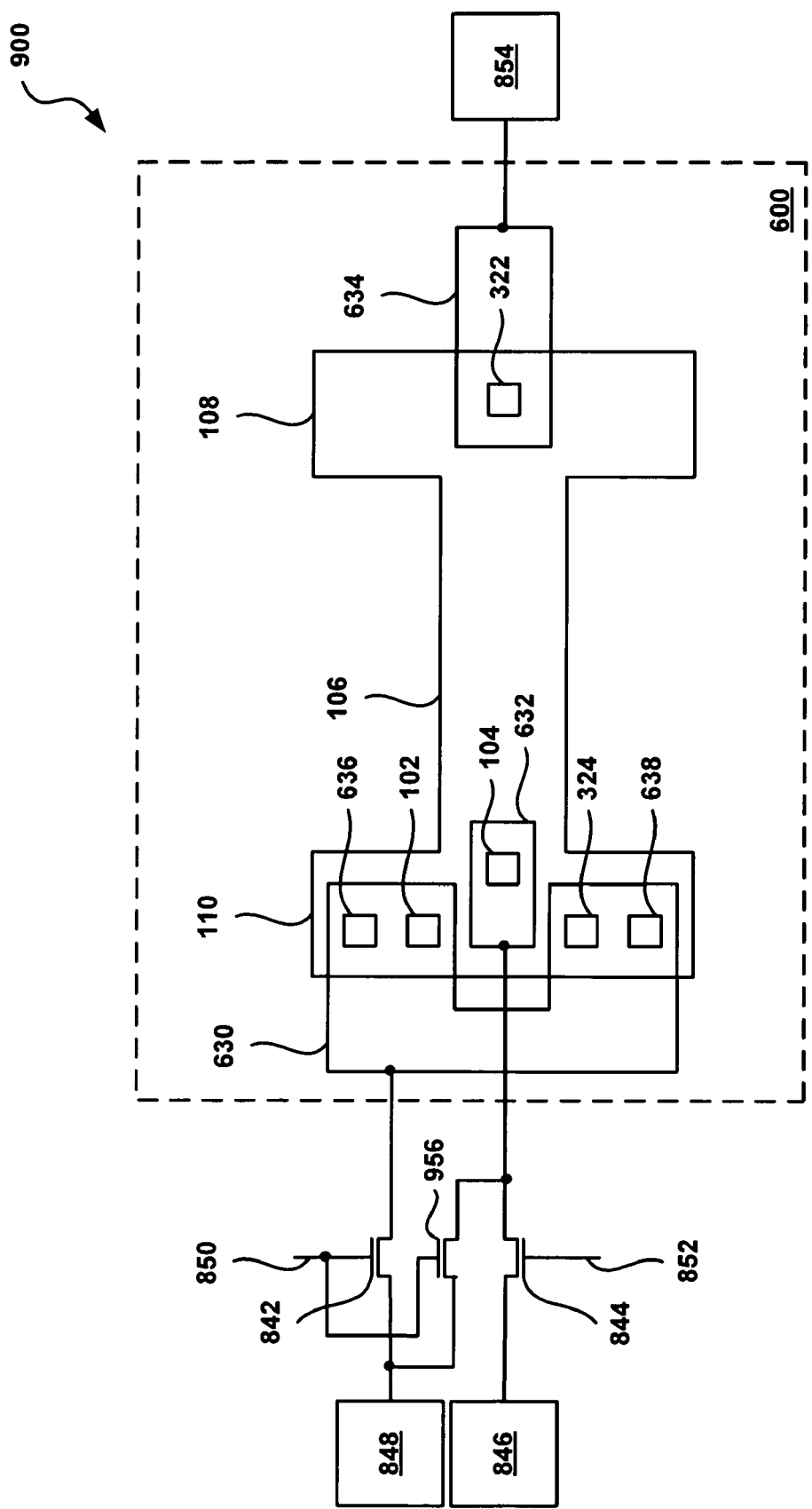
FIG. 9 illustrates a schematic diagram of a circuit that includes the fuse device of FIG. 6. A programming switch device, a reading switch device and a second programming switch device are coupled with the fuse device.

FIG. 9 illustrates a schematic diagram of a circuit 900 that includes a fuse device 600 as illustrated and described in connection with FIG. 6. The circuit 900 illustrated in FIG. 9 is similar to the circuit 800 illustrated in FIG. 8, but a third switch device 956 is included in the circuit 900. The third switch device 956 is herein called second programming switch device 956. In the implementation of FIG. 9, during the programming operation, the programming current may be applied through the programming contact members 102, 324, 636 and 638 via the programming switch 842 and through the reading contact member 104 via the second programming switch device 956. The second programming switch device 956 may couple the reading contact member 104 with the circuit portion 848 responsive to the first control signal 850. Alternatively, the control gate of the second programming switch device 956 may be coupled with a different control signal. With the reading contact member 104 contributing to the programming process, atoms of the fuse material layer 212 in an area below the reading contact member 104 may be removed more completely as compared to the implementation as illustrated and described in connection with FIG. 8.

As illustrated in FIG. 9, during the programming operation, all contact members 102, 104, 324, 636 and 638 of the second contact region 110 may be coupled with the circuit portion 848. During the reading operation, only a fraction of the contact members 102, 104, 324, 636 and 638 of the second contact region 110 may be coupled with the sensing circuit 846.

During a programming operation, the reading contact members 104 may be stressed by a current flowing through the second programming switch device 956. This may be avoided by selecting an appropriate size for the second programming switch device 956. In one implementation, the second programming switch device 956 may be smaller than the programming switch device 842.

Figure 10:
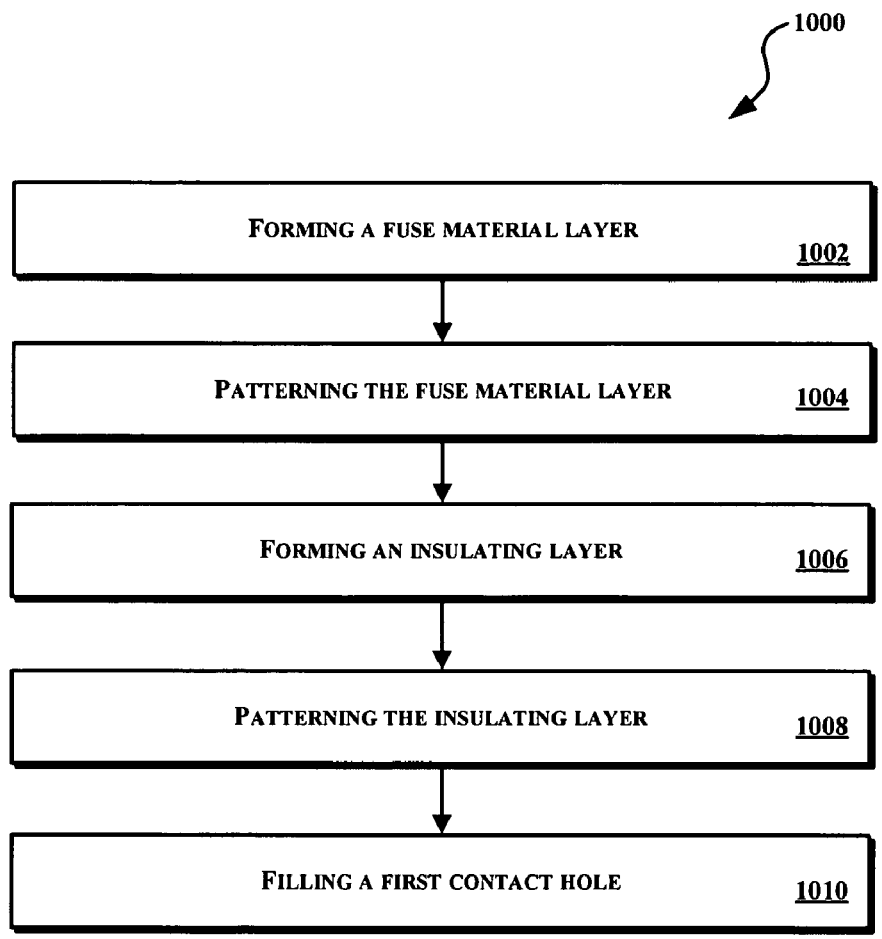
FIG. 10 illustrates a flow diagram that includes a number of operations for implementing a fuse device.
Figure 11:
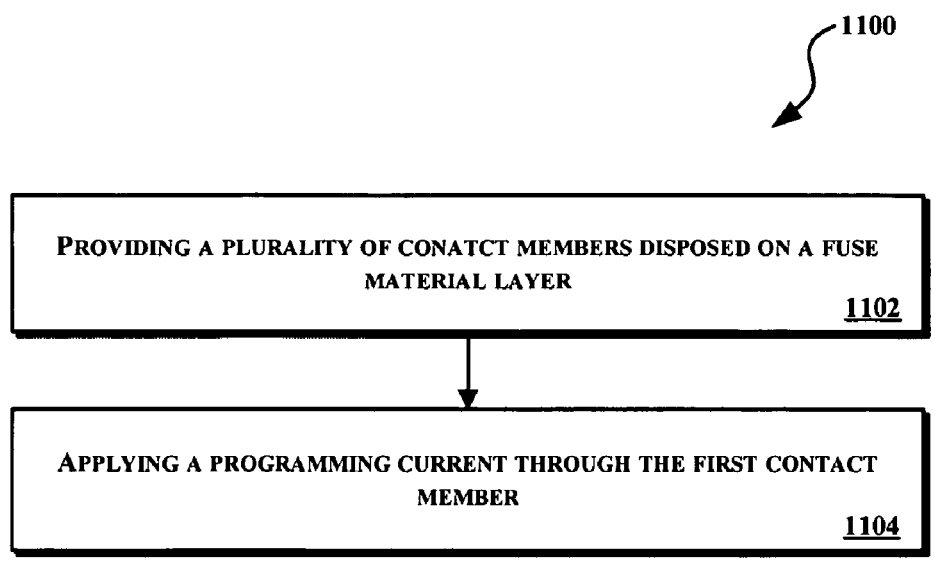
FIG. 11 illustrates a flow diagram that includes a number of operations for programming a fuse device.

FIG. 10 illustrates a flow diagram 1000 that includes a number of operations for implementing a fuse device. FIG. 11 illustrates a flow diagram 1100 that includes a number of operations for programming a fuse device. Unless stated otherwise, the order in which the operations are described is not intended to be construed as a limitation. Operations may be repetitive, may be combined in any order and/or may be in parallel to implement the process. In portions of the following discussion, reference may be made to the illustrations of FIGS. 1-9 and the subject matter thereof. The procedures described in FIGS. 10-11 may be realized utilizing the previously described implementations.

As illustrated in FIG. 10, at block 1002, a fuse material layer is formed over a substrate. The substrate may be a semiconductor substrate. The fuse material may be provided at a uniform thickness. In one implementation, forming the fuse material layer may include forming a polysilicon layer over the substrate and forming a silicide layer over the polysilicon layer.

At block 1004, the fuse material layer is patterned, whereby a fuse region is defined. The fuse region may be H-shaped. As illustrated and described in connection with FIGS. 1-9, the fuse region may include a first contact region, a fuse link region and a second contact region.

At block 1006, an insulating layer is formed over the fuse material layer. At block 1008, the insulating layer is patterned to define a plurality of contact holes at a first end of the fuse region. The first end of the fuse region may be the cathode of the fuse device.

At block 1010, a first contact hole of the plurality of contact holes is filled with electrically conducting material to define a first contact member. The first contact member is restricted to being usable during a programming operation of the fuse device.

In one implementation, a wiring layer may be formed over the insulating layer. The wiring layer may be patterned over the first contact member to form a connector. The connector may be electrically coupled with the fuse region via the first contact member. Similar to the first contact member, the connector may be restricted to being usable during the programming operation.

In one implementation, a second contact hole of the plurality of contact holes may be filled with electrically conducting material to define a second contact member. The second contact member may be restricted to being usable during a reading operation of the fuse device. A wiring layer may be patterned over the second contact member to form a second connector. The second connector may be electrically coupled with the fuse region via the second contact member. Similar to the second contact member, the second connector may be restricted to being usable during the reading operation.

The connector and the second connector may extend to a location outside the fuse region and they may electrically couple the fuse device with other components.

As illustrated in FIG. 11, at block 1102, a plurality of contact members is provided. The contact members are disposed on a fuse material layer. A first contact member of the plurality of contact members is restricted to being usable during a programming operation. The first contact member may be part of a cathode of a fuse device.

At block 1104, a programming current is applied through the first contact member to deplete an area of the fuse material layer below a second contact member of the plurality of contact members.

In one implementation, the programming current may be of sufficient magnitude to initiate electromigration in a fuse link of the fuse device. During a programming operation, the programming current may flow from an anode of the fuse device to the cathode of the fuse device and atoms may drift in the fuse material layer from the cathode to the anode.

In one implementation, the programming current and/or a programming time may be sufficient to deplete the whole area of the fuse material layer below the second contact member. This may lead to a high resistance of the programmed fuse device and to a predictable result when reading a state of the fuse device via the second contact member. In one implementation the second contact member may be restricted to being usable during a reading operation.

In one implementation, an area of the fuse material layer below the first contact member may not be depleted. Therefore, during programming of the fuse device, a stable connection between the first contact member and the fuse material layer may be maintained, and a constant programming current may be applied through the first contact member.

FIGS. 1-11 illustrate just exemplary implementations and there are numerous variations and modifications. Some of the variations and modifications will be mentioned further herein.

The number of contact members may differ from the number of contact members as illustrated and described in connection with FIGS. 1-11. For example, the first contact region 108 may include more than one contact member 322. Further, more than one reading contact member 104 of the second contact region 110 may be restricted to being usable during a reading operation. For a programming operation, only a subset of the contact members of the second contact region 110 may be used.

The number of connectors and the assignment of the contact members to the connectors may differ from the implementations as illustrated and described in connection with FIGS. 6-11. Further, the number of switch devices and the assignment of the connectors, to the switch devices may differ from the implementations as illustrated and described, in connection with FIGS. 8-11. For example, only one contact member may be coupled with the connector 630 and/or several contact members may be coupled with the connector 632. Additionally or alternatively, the programming contact members 102, 324, 636 and 638 may be coupled with several connectors, and these connectors may be restricted to being usable during a programming operation. These connectors may all be coupled with the programming switch device 842. Alternatively, these connectors may be coupled with several switch devices, and these switch devices may all receive the same control signal at their gate terminal. Alternatively, these switch devices may receive different control signals at their gate terminals.

The placement of the contact members may differ from the placement of the contact members as illustrated and described in connection with FIGS. 1-11. For example, one or more contact members of the second contact region 110 may be placed closer to the fuse link region 106 than other contact members of the second contact region 110. These one or more contact members may be used during a reading operation. In one implementation, these one or more contact members may be restricted to being usable during a reading operation.

As illustrated and described in connection with FIGS. 6-11, the programming connector 630 and the reading connector 632 may be formed in the same wiring layer 740 as the connector 634. Alternatively, several wiring layers may be disposed over the fuse material layer 212 and the connectors 630, 632 and 634 may be formed in different wiring layers. The wiring layer 740 as illustrated and described in connection with FIGS. 6-11 may include a patterned layer of copper or aluminium.

The contact members 102, 104, 322, 324, 636 and 638 as illustrated and described in connection with FIGS. 1-11 may include electrically conducting material, such as tungsten, aluminium or copper.

As described in connection with FIG. 2 and FIG. 10, the first layer 216 of the fuse material layer 212 may be polysilicon and the second layer 218 of the fuse material layer 212 may be a silicide. The silicide may include but may not be limited to cobalt silicide, nickel silicide, titanium silicide, tungsten silicide, tantalum silicide, platinum silicide, or any other metal capable of reacting with silicon/polysilicon to form a low resistivity thermally stable silicide. Other materials, with or without a silicide component, may also be suitable. The silicide layer 218 may have a thickness less than that of the polysilicon layer 216. The silicide layer 218 may have a first resistance and the polysilicon layer 216 may have a second resistance, which is greater than the first resistance.

The fuse material layer 212 may include more than two layers. Alternatively, the fuse material layer 212 may be a single layer of metal or metal compounds of suitable resistivity, including but not limited to aluminum, tungsten, and chromium.

The insulating layer 220, as illustrated and described in connection with FIG. 2, may be a silicon oxide layer or a silicon nitride layer.

In one implementation, a fuse device 100, 300, 500, 600 may be formed on a silicon-on-insulator (SOI) wafer, wherein a silicon substrate may be overlain by a buried oxide (BOX) layer. A fuse material layer 212 may be disposed on the buried oxide layer, which electrically and thermally isolates the fuse material layer 212 from a wafer substrate.

In one implementation, a fuse device 100, 300, 500, 600 may be formed in a shallow trench isolation (STI) zone and a fuse material layer 212 may be formed on a layer of insulation material, e.g., on a layer of silicon nitride or silicon oxide.

The circuits 800, 900 as illustrated and described in connection with FIGS. 8-9 may be implemented on a single integrated circuit. Alternatively, the circuits 800, 900 may be spread on several integrated circuits. For example, the sensing circuit 846 and/or the programming switch device 842 may be implemented on the integrated circuit, which includes the fuse device 600.

Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

What is claimed is:

1. A fuse device, comprising:
a fuse link region;
a first contact region disposed at a first end of the fuse link region; and
a second contact region disposed at a second end of the fuse link region, the second contact region comprises a plurality of contact members, wherein the plurality of contact members comprises at least one programming contact member for a programming operation and at least one reading contact member for a reading operation, wherein the at least one programming contact member and the at least one reading contact member are spaced apart from one another.

2. The fuse device according to claim 1, wherein the first contact region comprises at least one of a programming contact member for a programming operation or a reading contact member for a reading operation.

3. The fuse device according to claim 2, wherein the first contact region comprises an anode contact of the fuse device, and wherein the second contact region comprises a cathode contact of the fuse device.

4. The fuse device according to claim 2, wherein the at least one programming contact member of the plurality of contact members is disposed farther from the fuse link region than the at least one reading contact member of the plurality of contacts members.

5. The fuse device according to claim 3, wherein the second contact region further comprises a depleted area formed below the at least one reading contact member and a non-depleted area formed below the at least one programming contact member after the programming operation, and
wherein the depleted area is formed based on a transfer of atoms from the cathode contact to the anode contact of the fuse device during the programming operation.

6. The fuse device according to claim 1, wherein a fuse material layer is disposed over a semiconductor substrate and a wiring layer is disposed over the fuse material layer, wherein the plurality of contact members to form an electrical connection between the fuse material layer and the wiring layer.

7. The fuse device according to claim 6, further comprising a connector being formed in the wiring layer, wherein the at least one of the plurality of contact members is electrically coupled with the connector.

8. A fuse device, comprising:
a fuse link region:
a first contact region disposed at a first end of the fuse link region; and
a second contact region disposed at a second end of the fuse link region, the second contact region comprises a plurality of contact members, wherein the plurality of contact members comprises at least one programming contact member for a programming operation and at least one reading contact member for a reading operation;
a programming switch device coupled to the at least one programming contact member and a programming circuit coupled to the programming switch device; and
a reading switch device coupled to the at least one reading contact member and a sensing circuit coupled to the reading switch device.

9. The fuse device of claim 8, wherein the at least one reading contact member of the plurality of contact members is disposed closer to the fuse link region than the at least one programming contact member of the plurality of contact members.

10. The fuse device of claim 8, further comprising a first connector being formed in a wiring layer, wherein the at least one reading contact member of the plurality of contact members is electrically coupled with the first connector.

11. The fuse device of claim 10, further comprising a second connector being formed in the wiring layer, wherein at least one programming contact member of the plurality of contact members is electrically coupled with the second connector.

12. An integrated circuit, comprising:
a fuse device comprising a contact region, wherein the contact region comprises a plurality of contact members, the plurality of contact members includes at least one programming contact member for a programming operation and at least one reading contact member for a reading operation;
a first switch device coupled to the at least one programming contact member and a programming circuit; a second switch coupled to the at least one reading contact member and a sensing circuit; and
a third switch device coupled to first switch device and the at least one reading contact member.

13. The integrated circuit according to claim 12, wherein the third switch device is further coupled to the programming circuit.

14. The integrated circuit according to claim 12, wherein the contact region further comprises a depleted area formed below the at least one reading contact member in which less atoms are present than the at least one programming contact member.

15. The integrated circuit according to claim 12, wherein all of the plurality of contact members are coupled to the programming circuit during the programming operation, and at least one of the plurality of contact members is coupled to the sensing circuit during the reading operation.

16. The integrated circuit according to claim 12, wherein the first switch device is larger than the second switch device.

* * * * *